United States Patent
Egalon et al.

[11] Patent Number: 5,705,834
[45] Date of Patent: Jan. 6, 1998

[54] INCREASED EFFICIENCY LED

[75] Inventors: Claudio O. Egalon, Hampton; Robert S. Rogowski, Yorktown, both of Va.

[73] Assignee: The United States of America as represented by the Administrator of the National Aeronautics and Space Administration, Washington, D.C.

[21] Appl. No.: 644,654

[22] Filed: Apr. 23, 1996

[51] Int. Cl.⁶ .................................................. H01L 33/00
[52] U.S. Cl. ........................... 257/95; 257/79; 257/81; 257/94; 257/98
[58] Field of Search ........................... 257/13, 79, 82, 257/88, 84, 95, 96, 98

[56] References Cited

U.S. PATENT DOCUMENTS 5,233,204  8/1993  Fletcher et al. .................... 257/13
5,349,211  9/1994  Kato ................................... 257/90

Primary Examiner—Sara W. Crane
Assistant Examiner—Douglas A. Wille
Attorney, Agent, or Firm—Kimberly A. Chasteen

[57] ABSTRACT

In an LED a large portion of the light produced is lost due to total internal reflection at the air-semiconductor interface. A reverse taper of the semiconductor is used to change the angle at which light strikes the interface so that a greater portion of the light is transmitted.

5 Claims, 5 Drawing Sheets

5,705,834

INCREASED EFFICIENCY LED

ORIGIN OF THE INVENTION

The invention described herein was jointly made by an employee of the United States Government and a contract employee during the performance of work under NASA Contract No. NAS-1-19236. In accordance with 35 U.S.C. 202, the contractor elected not to retain title.

BACKGROUND OF THE INVENTION

1. Technical Field of the Invention

The present invention relates to increasing the efficiency of light generation in light emitting diodes (LEDs).

2. Discussion of the Related Art

In an LED, light is produced at the p-n junction of the diode. The LED is designed to allow the light produced to escape through an end face. However not all of the light is able to escape a diode in air because a portion is totally internally reflected at the interface between the diode and surrounding air. Due to the very high refractive index of most semiconductor materials, the portion of the light totally internally reflected is very large.

The portion of light transmitted by the LED will depend on the index of refraction of the LED as well as that of the medium in which the LED is placed. Often the medium will be air. Herein the transmitting portion of the LED will be known as the air semiconductor interface, however this should be understood to include any other medium in which an LED may operate. A critical angle, $\theta_c$, measured away from perpendicular, may be defined. Light impinging the air semiconductor interface at an angle less than the critical angle will refract through the interface. Light impinging at an angle greater than the critical angle will be totally internally reflected, remaining in the semiconductor.

One method used to overcome the problem of total internal reflection is to encapsulate the LED in plastic to better match refractive indices and reduce reflection at the interface. This allows a small increase in efficiency.

A second method is to shape the air-semiconductor interface into a hemisphere, thereby altering the angle at which light strikes the interface. This allows a greater portion of the light to be transmitted at the interface. The hemispherical shape, while allowing more light to be transmitted also contributes to diffusion of the light, thereby decreasing intensity.

Bergh, et. al. (U.S. Pat. No. 3,739,217, herein incorporated by reference) discusses the problem of total internal reflection in an LED. To overcome this problem the semiconductor surface is roughened through chemical or mechanical means. According to Bergh, et. al., light striking the rough surface will pass through at approximately the same rate as it would in an LED having a flat surface. In a rectangular shaped LED any light that impinges on an air-semiconductor interface at an angle that allows total internal reflection will never escape as each interface will be struck at the same angle. However, in a roughened LED that light which is internally reflected has a greater chance of exiting the LED upon striking the rough surface a second or succeeding time. This effect is a result of the random reflection at the rough surface, the light will strike at a random angle and this angle will change with each reflection from the roughened surface. Thus, an overall increase in efficiency is achieved by allowing light that has totally internally refracted to have a chance to escape on subsequent interactions with the air-semiconductor interface.

Yamanaka, et. al. (U.S. Pat. No. 4,080,245, herein incorporated by reference) also make use of geometric modifications of the emitting surface of an LED for the purpose of increasing light transmission efficiency across the air-semiconductor interface.

Figueroa, et. al. (U.S. Pat. No. 4,856,014, herein incorporated by reference) makes use of internal channels to guide light to the air-semiconductor interface at an angle less than the critical angle.

Haitz (U.S. Pat. No. 5,087,949, herein incorporated by reference) geometrically alters the air-semiconductor interface through the use of diagonally cut facets. These facets allow a greater portion of the light produced to strike an interface at an angle less than the critical angle. Additionally, as with the Bergh invention, totally internally reflected light will strike the air-semiconductor interface at a varying angle since the LED is not rectangular, thus allowing light to escape upon striking an interface multiple times.

Fletcher, et. al, (U.S. Pat. No. 5,233,204, herein incorporated by reference) present an LED having a thick transparent layer overlying the light generation region of the LED. This improvement is directed towards LEDs that make use of an electrically conductive transparent window layer between the light generation region and a top metal contact. The thick transparent layer allows more light to escape from the sides of the LED than would be able to with a thin electrically conductive transparent window. One embodiment of the invention makes use of non-parallel sides for the thick electrically conductive transparent window layer so that more light may refract through the interface between the window and the surrounding medium.

Egalon and Rogowski (U.S. app. Ser. No. 08/636,453, filed Apr. 23, 1996 herein incorporated by reference) concerns untrapping light in an optical fiber having high numerical aperture. It also makes use of geometric modifications of a reflecting surface to modify the angle of incidence of light so that it may refract through an air interface instead of being totally internally reflected.

SUMMARY OF THE INVENTION

It is an object of the present invention to provide a p-n type semiconductor LED capable of efficiently transmitting light produced at the p-n junction through the air-semiconductor interface.

It is a further object of the present invention to do so without the use of plastic encapsulation or difficult machining of the semiconductor material into a hemispherical shape.

To achieve the forgoing objects a LED is presented that makes use of reverse tapering to alter the path of light produced such that more is able to be transmitted through the air-semiconductor interface.

DESCRIPTION OF PREFERRED EMBODIMENTS

Figure 1:
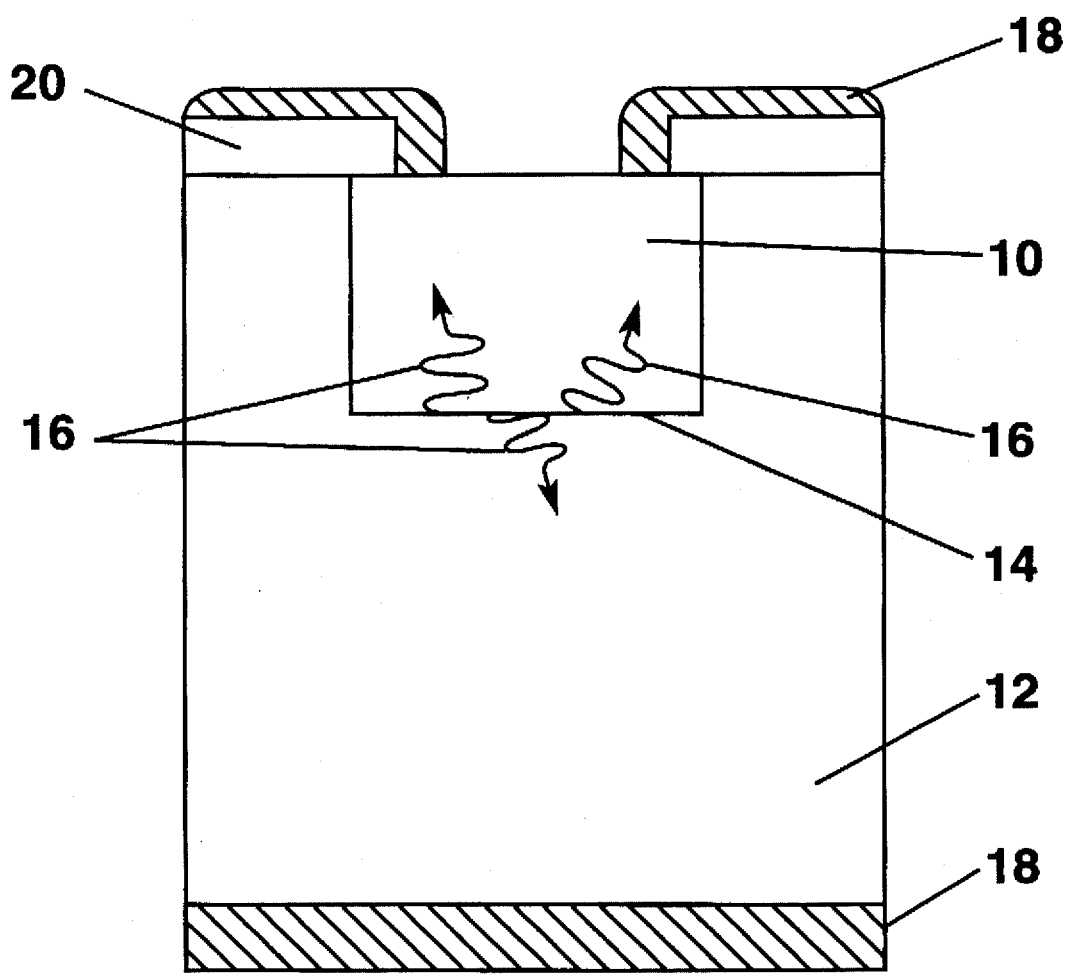
FIG. 1 is a drawing showing the generation of light at the p-n junction of a semiconductor LED.

Making reference to FIG. 1, an n-p semiconductor is shown. At the p-n junction 14 between n type semiconductor region 10 and p type semiconductor region 12 photons 16 are produced when electricity is applied to electrical contacts 18. Oxide layer 20 serves as an electrical insulator.

Figure 2:
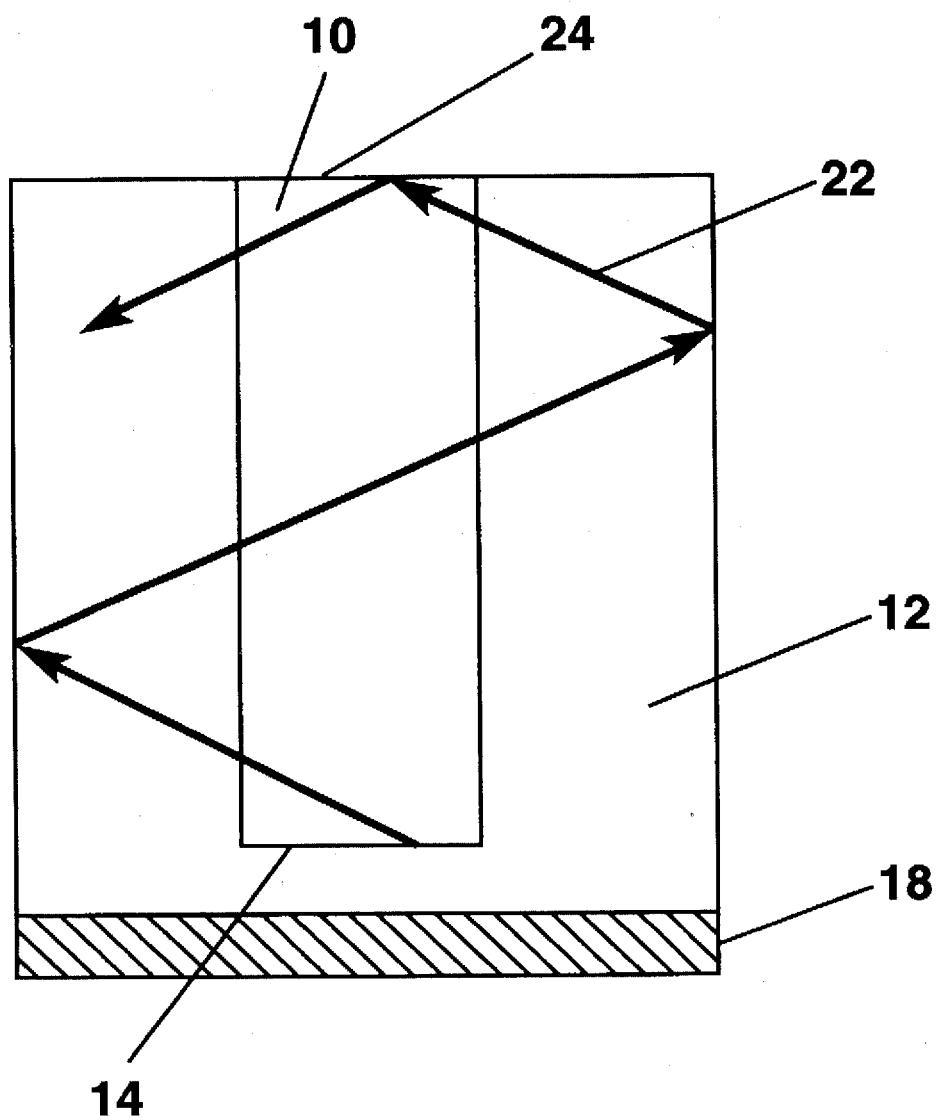
FIG. 2 is a drawing showing the total internal reflection of a light ray at a air-semiconductor interface in a semiconductor LED.

Making reference to FIG. 2, total internal reflection is shown in a semiconductor LED similar to that in FIG. 1. A light ray 22 is produced at the p-n junction 14 as in FIG. 1. The light ray travels to the air-semiconductor interface 24 where it is totally internally reflected.

Figure 3:
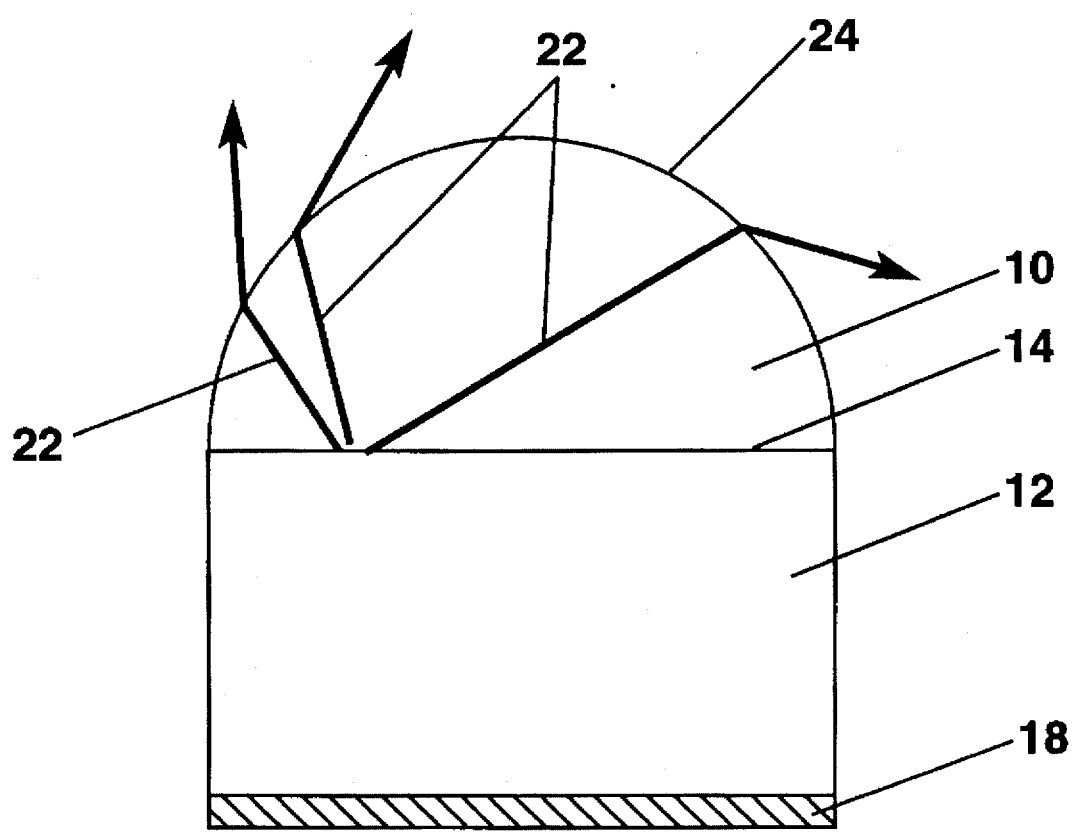
FIG. 3 is a drawing of light being refracted through a hemispherical interface.

FIG. 3 shows a semiconductor LED in which the air-semiconductor interface 24 is shaped in a hemisphere. Light rays 22 produced at the p-n junction 14 are refracted through the air-semiconductor interface 24. Note that these light rays are dispersed as a result of refracting through the curved surface.

Figure 4:
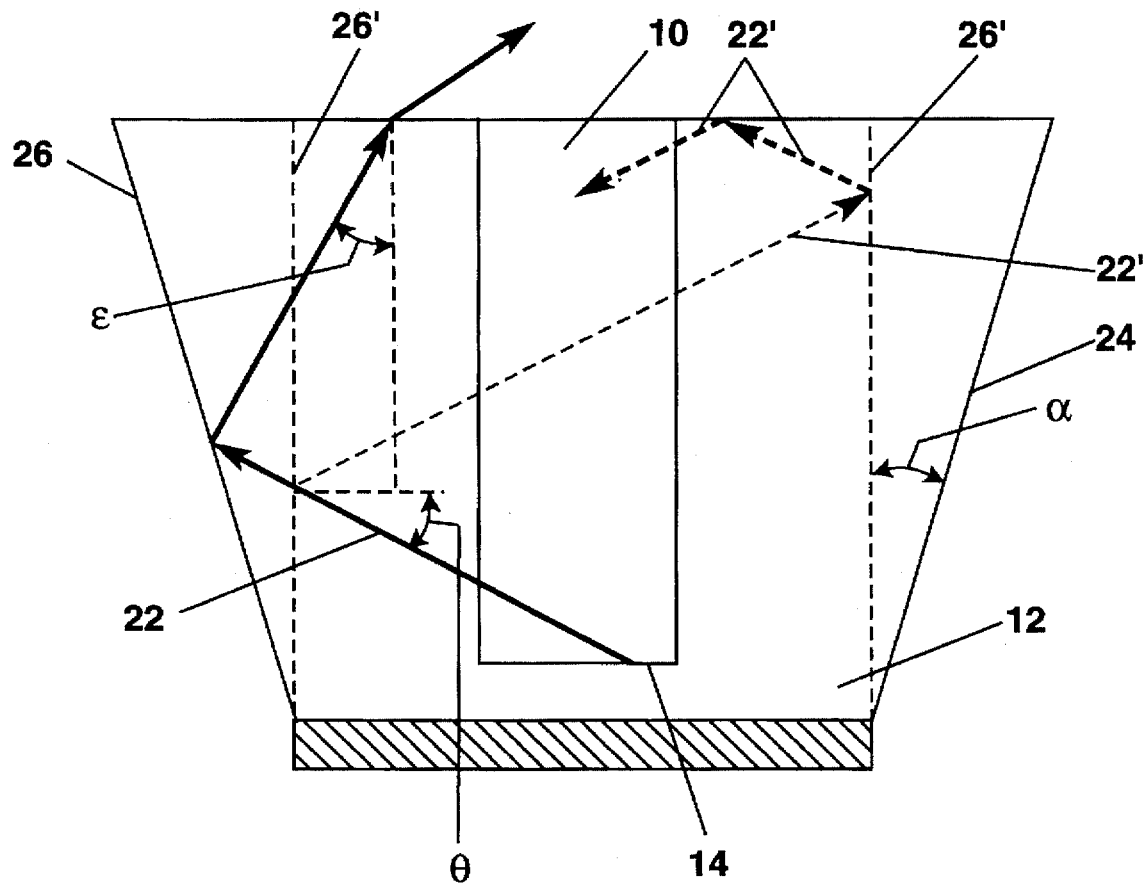
FIG. 4 is a drawing of a semiconductor having a reverse taper, showing a sample light path for a beam being refracted through the interface, dashed lines show how the same beam would be totally internally reflected in an untapered LED.
Figure 5:
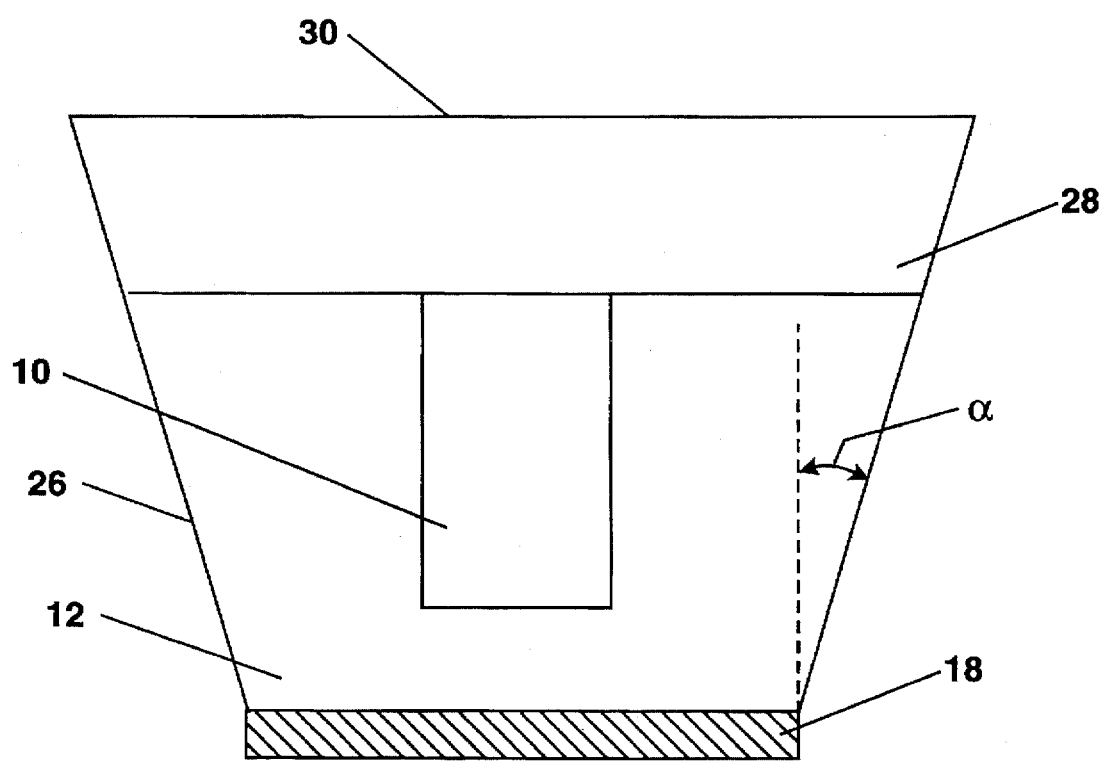
FIG. 5 is a drawing of a semiconductor LED with tapered sides and the addition of an end face with a refractive index chosen to reduce total internal reflection.

FIG. 4 shows an LED according to the present invention. As in the LED of FIG. 1 an n-type semiconductor region 10 is surrounded by a p-type semiconductor region 12. Light rays are produced at the p-n junction 14. A light ray 22 traveling at angle $\theta$ reflects off of the reverse tapered side of the LED 26 and continues to the air-semiconductor interface 24. It strikes the interface 24 at an angle $\epsilon$ and refracts through. Dashed lines 26' show the sides of an untapered LED. Dashed arrows 22' represent the path of the same light ray in an untapered LED. Light ray 22' strikes the interface 24 at an angle $\epsilon'$ (not shown) and is totally internally reflected. Angle $\alpha$ is the angle at which the sides of the LED are reverse tapered. Making reference now to FIG. 5, another embodiment of the present invention is shown. As in the LED of FIG. 1 an n-type semiconductor region 10 is surrounded by a p-type semiconductor region 12. In addition to the tapered side of the LED 26 as in FIG. 4 another layer 28 is added between the surface of the semiconductor and the air 30. This layer 28 is chosen to have an index of refraction lower than that of the semiconductor materials. The use of a lower index of refraction material in the interface region helps to reduce total internal reflection.

In the examples are shown an n-p type LED, that is an n-type semiconductor is surrounded by a p-type semiconductor. This arrangement may be preferable because the refractive index of a p type semiconductor may be made slightly lower than that of an n type semiconductor, providing a waveguide configuration. However a p-n type LED may also be used with the reverse taper surface to some advantage. As the difference in refractive indices is generally small between n and p type semiconductors the waveguiding effect would tend to be small.

The index of refraction of region 10 is given to be $n_1$, the index of refraction of region 12 is given as $n_2$, and the index of refraction of the medium surrounding the LED is given as $n_0$. Light impinging the air-semiconductor interface will refract through the interface if the critical condition is met. For light in region 10 this is that sin $\epsilon < n_0/n_1$, that is, light striking the interface at an angle closer to the normal angle than $\epsilon$ will refract through, and light striking the interface at an angle closer to parallel than $\epsilon$ will be totally internally reflected. Light in region 12 must meet the condition sin $\epsilon < n_0/n_2$. In the case where the LED is in air, $n_0=1$, generally $n_1$ and $n_2$ are both much higher than 1. In addition, as noted above, $n_1$ is approximately equal to $n_2$ so in a first approximation the conditions for the two regions may be considered to be the same.

The above conditions may be used to determine an advantageous choice for $\alpha$, the angle of taper of the sides of the semiconductor, for purposes of this discussion only $n_1$ will be used, $n_2$ may be trivially substituted when necessary, however here we take them to be equivalent:

$$0 < \sin \epsilon < (n_0/n_1) \tag{1}$$

where:

$$\epsilon = (\pi/2 - \theta) \text{ when } (\epsilon/2 - \theta) \leq \alpha \tag{2}$$

and, $$\epsilon = 2\alpha - (\pi/2 - \theta) \text{ when } (\pi/2 - \theta) > \alpha \tag{3}$$

and, $$0 < \theta < \pi/2 \tag{4}$$

Equation one gives the critical conditions for light to refract through the air-semiconductor interface as discussed above. Equation two merely states that light traveling at an angle that does not cause it to intersect with the tapered sides will not have any dependance on $\alpha$. Note that the angle $\theta$ is measured from the normal angle to the side of an untapered semiconductor. Thus, $(\pi/2-\theta)$ gives $\epsilon$ which is measured from the normal angle to the air-semiconductor interface. Equation three shows the dependance on $\alpha$ of light traveling at an angle $\theta$ such that it intersects with the tapered sides of the semiconductor. Note here that since the distance from the production of light at the p-n junction to the tapered sides of the semiconductor is non-zero, the given conditions for intersection do not strictly hold over small distances. That is, in an LED having a short optical path from the p-n junction to the air-semiconductor interface compared with the width of the LED, the conditions given in Eqns. 2 and 3 are only approximations. Some light having $(\pi/2-\theta)<\alpha$ will obey Eqn. 2 rather than Eqn. 3. The angle $\alpha$ may therefore be chosen by optimizing Eqns. 1 and 3. This optimization will depend on the ratio of width to height of the LED as well as factors such as the rate of absorption of light by the LED material, and the values of $n_1$ and $n_0$.

In optimizing equations 1 and 3 for $\alpha$ it may become apparent that a single value of $\alpha$ is not the best solution. Instead, a varying $\alpha$, providing a curved taper rather than a straight reverse taper may enable a larger amount of light to be untrapped.

Other applications and modifications of the present invention will be apparent to those skilled in the art. The above embodiments are not exhaustive but rather given by way of example. It is understood that the present invention is capable of numerous modifications within the scope of the following claims.

We claim:

1. A light emitting diode comprising:

two semiconductor regions forming a light producing diode junction;

a light emitting end face;

a first one of the two semiconductor regions forming an outer volume, surrounding a second of the two semiconductor regions;

a base, opposed to the light emitting end face;

a plurality of sides of the outer volume, the sides connecting the light emitting end face to the base;

the sides further defining a reverse taper such that the cross sectional area of the light emitting diode is greater at the light emitting end face than at the base.

2. A light emitting diode according to claim 1 wherein the sides are curved to produce a curved reverse taper.

3. A light emitting diode according to claim 1 further comprising:

a layer having an index of refraction between that of the light emitting diode at the light emitting end face and that of a medium in which the light emitting diode is to be operated;

the layer directly optically connected to the light emitting end face.

4. A light emitting diode according to claim 3 wherein the sides are curved to produce a curved reverse taper.

5. A light emitting diode according to claim 3 wherein the layer is chosen to be of a shape such that it continues the reverse taper of the light emitting diode.

* * * * *